(12) United States Patent
Miura

(10) Patent No.: US 10,937,733 B2
(45) Date of Patent: Mar. 2, 2021

(54) SEMICONDUCTOR DEVICE

(71) Applicant: Mitsubishi Electric Corporation, Tokyo (JP)

(72) Inventor: Takeshi Miura, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/476,503

(22) PCT Filed: Apr. 25, 2017

(86) PCT No.: PCT/JP2017/016385
§ 371 (c)(1),
(2) Date: Jul. 8, 2019

(87) PCT Pub. No.: WO2018/198199
PCT Pub. Date: Nov. 1, 2018

(65) Prior Publication Data
US 2020/0051910 A1    Feb. 13, 2020

(51) Int. Cl.
| | | |
|---|---|---|
| H01L 23/00 | (2006.01) | |
| H01L 21/00 | (2006.01) | |
| H01L 23/522 | (2006.01) | |
| H01L 23/532 | (2006.01) | |

(52) U.S. Cl.
CPC .... *H01L 23/5226* (2013.01); *H01L 23/53295* (2013.01)

(58) Field of Classification Search
CPC .................................................. H01L 23/5226
USPC ...................... 438/50–53; 257/254, 415–420
See application file for complete search history.

(56) References Cited

U.S. PATENT DOCUMENTS

| | | | | |
|---|---|---|---|---|
| 5,943,597 A | * | 8/1999 | Kleffner | H01L 24/13 |
| | | | | 257/737 |
| 10,163,661 B2 | * | 12/2018 | Chen | H01L 25/0657 |
| 2008/0217769 A1 | | 9/2008 | Yanase et al. | |
| 2010/0193796 A1 | | 8/2010 | Nakano | |
| 2011/0147882 A1 | | 6/2011 | Tsutsue | |
| 2011/0175193 A1 | | 7/2011 | Nakagawa | |
| 2015/0035156 A1 | | 2/2015 | Ichinose et al. | |

FOREIGN PATENT DOCUMENTS

| | | |
|---|---|---|
| CN | 101834203 A | 9/2010 |
| CN | 102165576 A | 8/2011 |
| JP | 2006-012286 A | 1/2006 |
| JP | 2007-123286 A | 5/2007 |
| JP | 2008-277742 A | 11/2008 |

(Continued)

OTHER PUBLICATIONS

Seo et al, Color Image Sensor using Three Stacked Organic Photoconductive Films with Silicon Nitrides Interlayer Insulators, NHK STRL R&D, Sep. 2015, p. 29-34, No. 153.

(Continued)

*Primary Examiner* — Calvin Lee
(74) *Attorney, Agent, or Firm* — Studebaker & Brackett PC

(57) ABSTRACT

An insulating film (2) is provided on a base material (1). The insulating film (2) is a compressive film in which a stress is applied in a direction of peeling away from the base material at a central portion. A recess (3) is formed in the central portion of the insulating film (2) so that a thickness is partially reduced.

4 Claims, 8 Drawing Sheets

(56) References Cited

FOREIGN PATENT DOCUMENTS

| JP | 2008-311543 A | 12/2008 |
| JP | 2009-231399 A | 10/2009 |
| JP | 2010-171072 A | 8/2010 |
| JP | 2015-032661 A | 2/2015 |

OTHER PUBLICATIONS

International Search Report; Written Opinion; and Notification of Transmittal of the International Search Report and the Written Opinion of the International Searching Authority, or the Declaration issued in PCT/JP2017/016385; dated Jun. 20, 2017.
An Office Action issued by Taiwanese Patent Office dated Mar. 12, 2018, which corresponds to Taiwanese Patent Application No. 106118493.
An Office Action; "Notification of Reasons for Refusal," mailed by the Japanese Patent Office dated Aug. 1, 2017, which corresponds to Japanese Patent Application No. 2017-535933; with English language translation.

\* cited by examiner

SEMICONDUCTOR DEVICE

FIELD

The present invention relates to a semiconductor device wherein an insulating film is formed between wirings or on the wirings.

BACKGROUND

In a semiconductor device, wirings are three-dimensionally arranged with overlapping in order to minimize the chip size. Then, an insulating film is formed between the wirings or on the wirings in order to ensure insulation. In the laminated structure of the wiring and the insulating film, the insulating film may peel off or float due to a spread in various parameters, or a crack may be generated thereby in the film. As measures to prevent the peeling of the insulating film, adhesion improvement (see, for example, PTL 1), treatment after film formation (see, for example, PTL 2), film quality control (see, for example, PTL 3), relaxation film insertion (see, for example, NPL 1), and the like have been considered, although with respect to different films and structures.

CITATION LIST

Patent Literature

[PTL 1] Japanese Patent Application Publication No. 2009-231399
[PTL 2] Japanese Patent Application Publication No, 2008-311543
[PTL 3] Japanese Patent Application Publication No. 2010-171072

Non Patent Literature

[NPL 1] NHK STRL R&D/No. 153/2015 P. 29-34

SUMMARY

Technical Problem

In the conventional semiconductor device, in the insulating film formed between the wirings or on the wirings, there are places where a stress from the insulating film or the metal wiring is concentrated. In such places, intermittent film peeling, film floating, or film cracking can occur accidentally. For this reason, NG determination is made due to quality concerns and the yield is greatly affected. The conceivable causes thereof may be, for example, the deterioration of adhesion in the contact portion due to the influence of organic residue, the instability of pretreatment in forming the wiring on the insulating film, and the stress of the insulating film. Among them, the stress of the insulating film is considered to be the root cause, and various measures such as film quality control of the insulating film and insertion of a stress relaxation layer are considered. However, the characteristics cannot be freely ensured which makes it impossible to ensure stably the yield and quality.

The present invention has been accomplished to solve the above-described problems, and an object thereof is to obtain a semiconductor device capable of stably ensuring the yield and quality.

Solution to Problem

A semiconductor device according to the present invention includes: a base material; and an insulating film provided on the base material, wherein the insulating film is a compressive film in which a stress is applied in a direction of peeling away from the base material at a central portion, and a recess is formed in the central portion of the insulating film so that a thickness is partially reduced.

Advantageous Effects of Invention

In the present invention, the recess is formed in the central portion of the insulating film which is a compressive film, and the thickness is partially reduced. For this reason, the stress applied in the direction of peeling off from the base material can be reduced. Therefore, peeling, floating and cracking of the insulating film can be stably suppressed. As a result, yield and quality can be stably ensured.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

In general, an insulating film can be formed on a base material at any place of a semiconductor device. The base material is, for example, a semiconductor substrate, a semiconductor layer that was epitaxially grown, another insulating film, or a metal film such as a wiring or an electrode. As the insulating film, a nitride film or an oxide film such as an SiN film, an SiON film, or an SiO film is often used.

Figure 1:
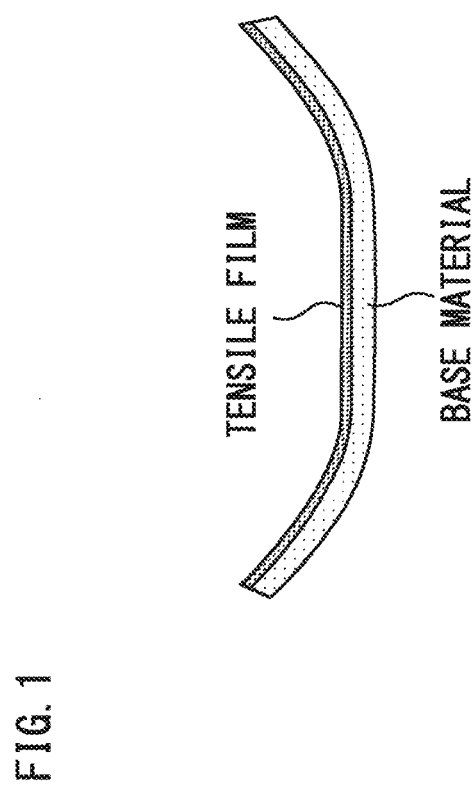
FIG. 1 is a cross-sectional view showing a film stress of a compressive film and a tensile film.
Figure 1:
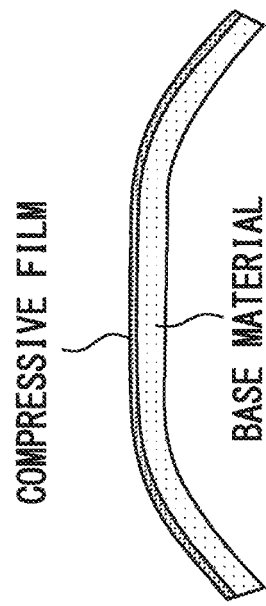

FIG. 1 is a cross-sectional view showing a film stress of a compressive film and a tensile film. The insulating films are classified into two types in which the direction of stress applied to the film itself differs depending on the film forming apparatus, film forming method, film forming condition, and the like. In a compressive film, a stress is applied in the direction of peeling away from the base material at the central portion. In a tensile film, a stress is applied in the direction of peeling from the base material at the outer peripheral portion. For this reason, the film peels off or floats, or a crack appears in the film at a portion where a stress exceeding the adhesion between the base material and the insulating film is applied.

Figure 2:
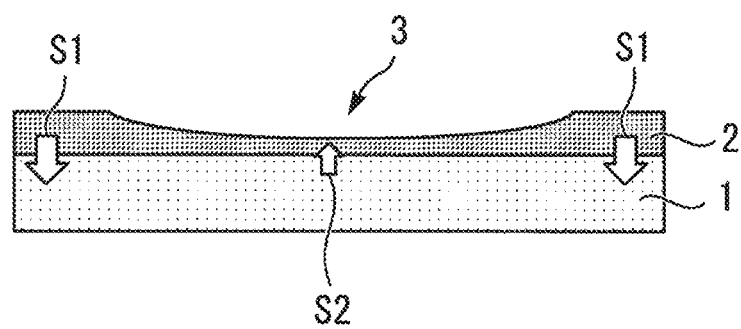
FIG. 2 is a cross-sectional view showing the semiconductor device according to Embodiment 1 of the present invention.

FIG. 2 is a cross-sectional view showing the semiconductor device according to Embodiment 1 of the present invention. An insulating film 2 which is a compressive film is formed on a base material 1. A recess 3 is formed in the central portion of the insulating film 2 so that the thickness is partially reduced.

Figure 3:
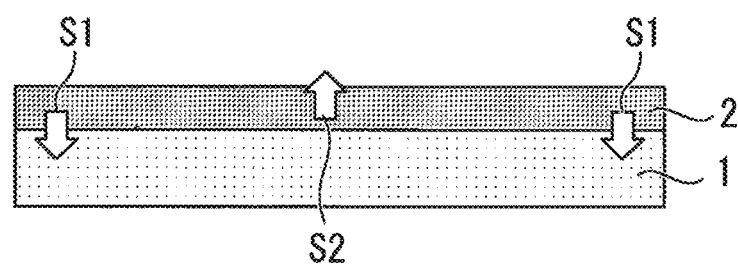
FIG. 3 is a cross-sectional view showing a semiconductor device according to Comparative Example 1.

FIG. 3 is a cross-sectional view showing a semiconductor device according to Comparative Example 1. In Comparative Example 1, the recess 3 is not formed. In the insulating film 2 which is a compressive film, a stress S1 is applied in the direction toward the base material 1 at the outer peripheral portion, and a stress S2 is applied in the direction of peeling off from the base material 1 at the central portion.

Figure 4:
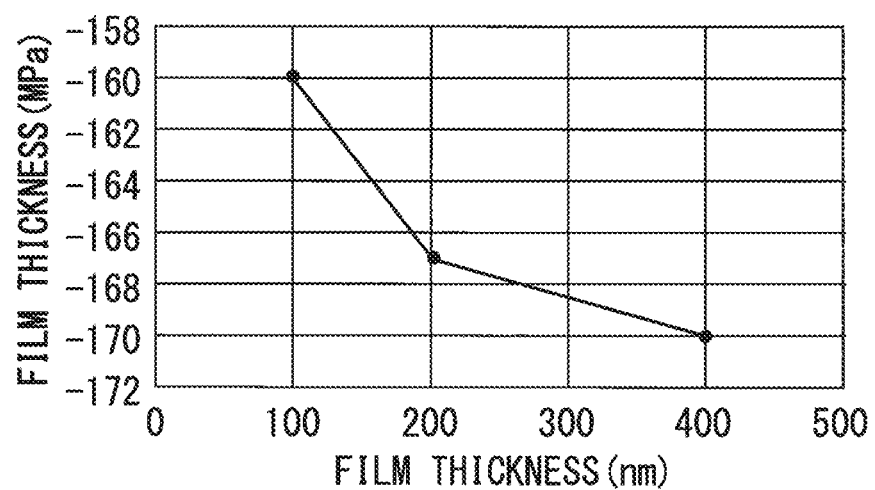
FIG. 4 is a graph showing the results of experiments on the relationship between the film thickness and the film stress of the insulating film.

FIG. 4 is a graph showing the results of experiments on the relationship between the film thickness and the film stress of the insulating film. From this graph, it can be seen that the film stress decreases as the film thickness is reduced. In the present embodiment, the recess 3 is formed in the central portion of the insulating film 2 which is a compressive film so that the thickness is partially reduced. For this reason, the stress S2 applied in the direction of peeling off from the base material 1 can be reduced. Therefore, peeling, floating and cracking of the insulating film 2 can be stably suppressed. As a result, yield and quality can be stably ensured.

Embodiment 2

Figure 5:
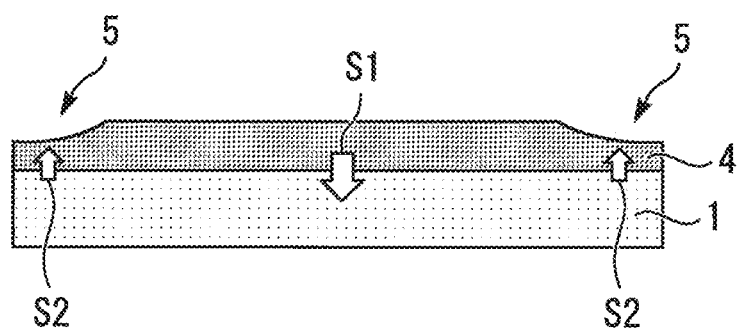
FIG. 5 is a cross-sectional view showing a semiconductor device according to Embodiment 2 of the present invention.

FIG. 5 is a cross-sectional view showing a semiconductor device according to Embodiment 2 of the present invention. An insulating film 4 which is a tensile film is formed on the base material 1. A recess 5 is formed in the outer peripheral portion of the insulating film 4 so that the thickness is partially reduced.

Figure 6:
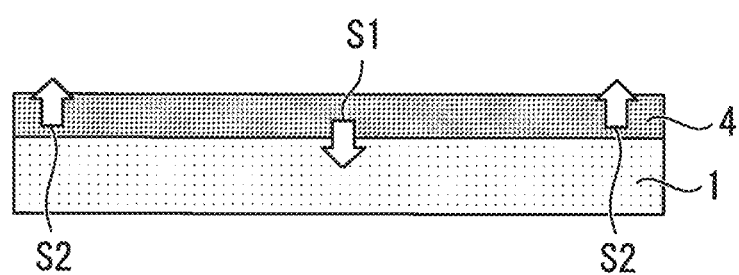
FIG. 6 is a cross-sectional view showing a semiconductor device according to Comparative Example 2.

FIG. 6 is a cross-sectional view showing a semiconductor device according to Comparative Example 2. In Comparative Example 2, the recess 5 is not formed. The stress S1 is applied to the insulating film 4 which is a tensile film in the direction of the base material 1 at the central portion, and the stress S2 is applied in the direction of peeling off from the base material 1 at the outer peripheral portion.

In the present embodiment, the recess 5 is formed in the outer peripheral portion of the insulating film 4 which is a tensile film so that the thickness is partially reduced. For this reason, the stress S2 applied in the direction of peeling off from the base material 1 can be reduced. Therefore, peeling, floating and cracking of the insulating film 4 can be stably suppressed. As a result, yield and quality can be stably ensured.

Embodiment 3

Figure 7:
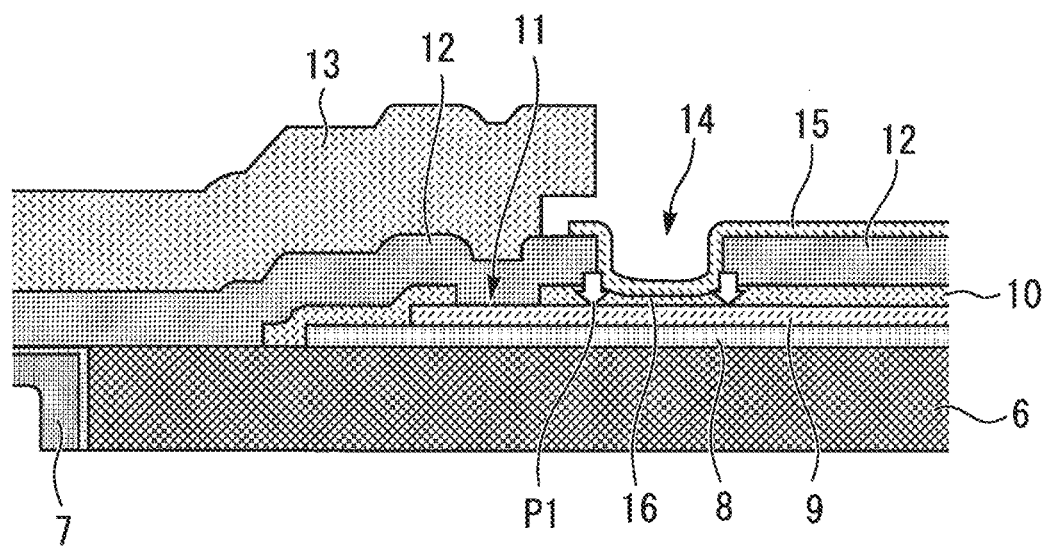
FIG. 7 is a cross-sectional view showing a semiconductor device according to Embodiment 3 of the present invention.

FIG. 7 is a cross-sectional view showing a semiconductor device according to Embodiment 3 of the present invention.

A back surface via hole 7 is formed in a semiconductor substrate 6. An underlying insulating film 8 is formed on the semiconductor substrate 6, and an underlying metal wiring 9 is formed on the underlying insulating film. An interlayer insulating film 10 is formed on the underlying metal wiring 9. An opening 11 is formed in the interlayer insulating film 10. An intermediate metal wiring 12 is formed on the interlayer insulating film 10. The intermediate metal wiring 12 is connected to the underlying metal wiring 9 through the opening 11. An upper metal wiring 13 is formed on the intermediate metal wiring 12.

The intermediate metal wiring 12 has an opening 14. After an upper insulating film 15 has been formed on the entire surface, patterning is performed so that the upper insulating film 15 covers the intermediate metal wiring 12 and the opening 14. A recess 16 is formed in the interlayer insulating film 10 at the central portion of the opening 14 so that the thickness is partially reduced.

Figure 8:
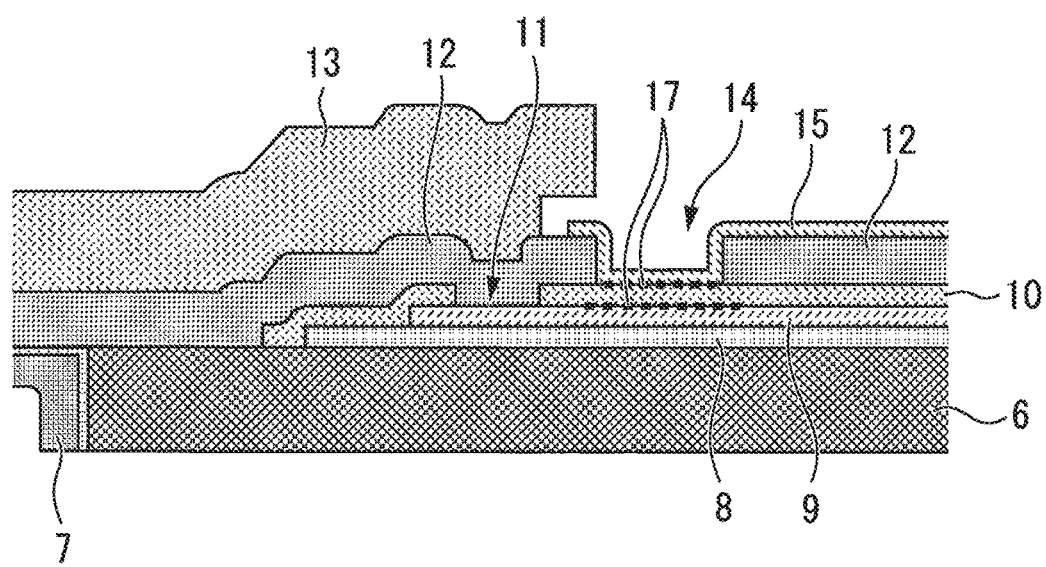
FIG. 8 is a cross-sectional view showing a semiconductor device according to Comparative Example 3.

Subsequently, the effect of the present embodiment will be described in comparison with a comparative example. FIG. 8 is a cross-sectional view showing a semiconductor device according to Comparative Example 3. In Comparative Example 3, the recess 16 is not formed. In particular, in the case where the interlayer insulating film 10 is a compressive film, in addition to the stress applied to the end portion, a pressure P1 in the vertical direction is also applied from the intermediate metal wiring 12. Therefore, a stress is applied to the interlayer insulating film 10 in the direction of peeling off from the underlying metal wiring 9 at the central portion of the opening 14. As a result, in the comparative example, peeling, floating and cracks 17 of the interlayer insulating film 10 occur.

In contrast in the present embodiment, the recess 16 is formed in the interlayer insulating film 10 at the central portion of the opening 14, and the thickness is partially reduced. As a result, the stress applied in the direction of peeling off from the base material 1 can be reduced, so that peeling, floating and cracks of the interlayer insulating film 10 can be stably suppressed. As a result, yield and quality can be stably ensured. Even when the interlayer insulating film 10 is a tensile film, the stress at the central portion of the opening 14 is relaxed, so the effect is obtained although it is not as large as with the compressive film.

Embodiment 4

Figure 9:
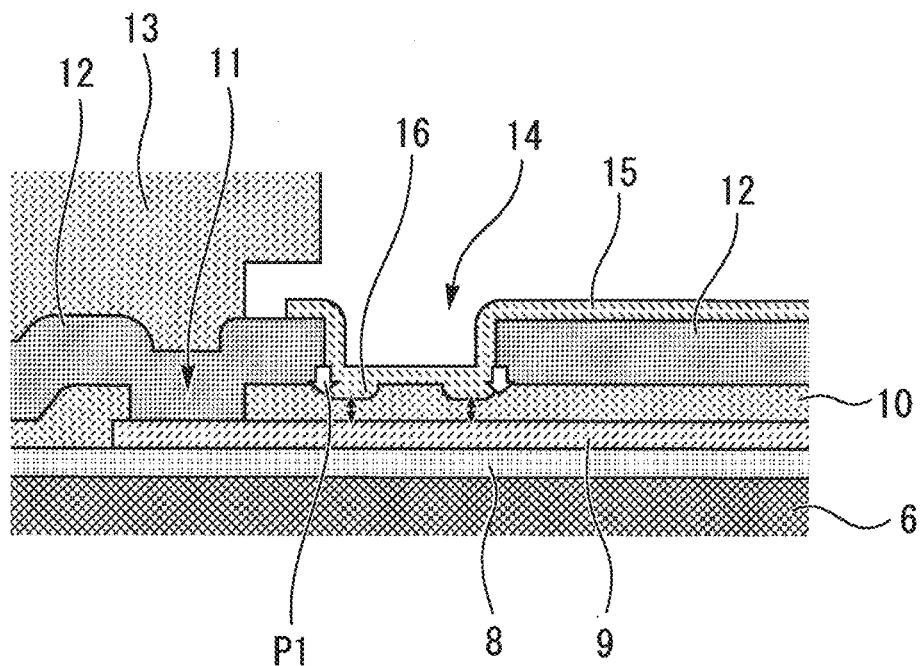
FIG. 9 is a cross-sectional view showing a semiconductor device according to Embodiment 4 of the present invention.

FIG. 9 is a cross-sectional view showing a semiconductor device according to Embodiment 4 of the present invention. When the interlayer insulating film 10 is a compressive film, in addition to the stress applied to the end portion, the pressure P1 in the vertical direction is also applied from the intermediate metal wiring 12. Further, even in the case where the interlayer insulating film 10 is a tensile film, a force acts in the warping direction, that is, upward, in the lower part of the end portion of the intermediate metal wiring 12.

Therefore, in the present embodiment, the recess 16 is formed in the interlayer insulating film 10 at the edge of the opening 14 of the intermediate metal wiring 12 so that the thickness is partially reduced. By forming the recess 16 in the vicinity of the portion to which the pressure P1 is applied as described above, the stress can be relieved, and therefore peeling, floating, and cracking of the interlayer insulating film 10 can be stably suppressed. As a result, yield and quality can be stably ensured.

Embodiment 5

Figure 10:
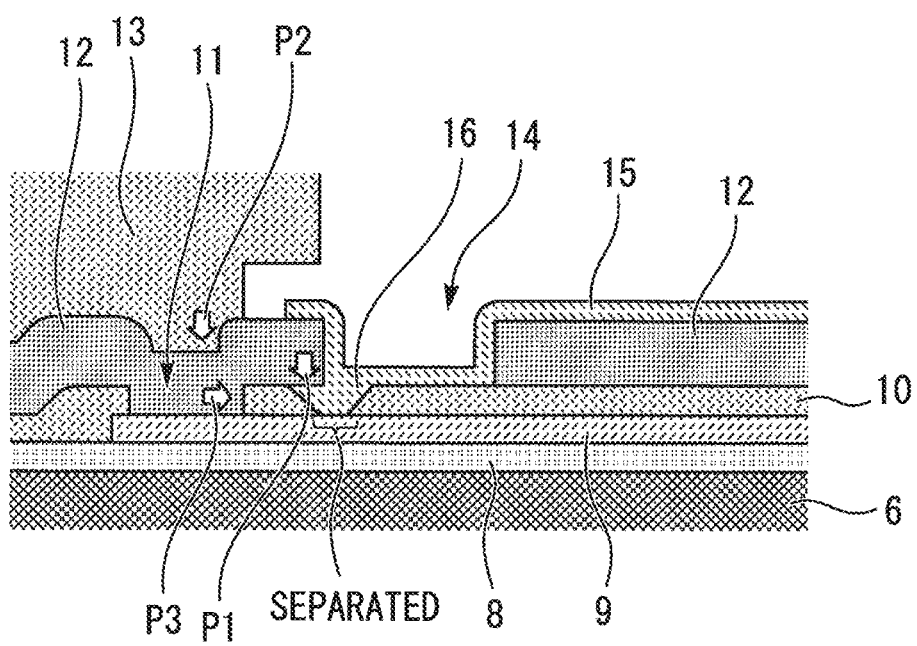
FIG. 10 is a cross-sectional view showing a semiconductor device according to Embodiment 5 of the present invention.

FIG. 10 is a cross-sectional view showing a semiconductor device according to Embodiment 5 of the present invention. In the vicinity of the opening 14 connecting the intermediate metal wiring 12 and the underlying metal wiring 9, the pressure P1 in the vertical direction is applied to the interlayer insulating film 10 from the end portion of the intermediate metal wiring 12. In addition, a pressure P2 in the vertical direction is applied from the upper metal wiring 13 to the intermediate metal wiring 12. Furthermore, under the effect of these vertical pressures, a pressure P3 in the horizontal direction is also applied from the intermediate metal wiring 12 to the interlayer insulating film 10. If these pressures are not relieved, the stress on the interlayer insulating film 10 becomes the strongest at the lower part of the end portion of the intermediate metal wiring 12, which leads to film peeling, film floating, and film cracking.

In the present embodiment, a tapered recess 16 is formed in the interlayer insulating film 10 in the lower part of the end portion of the intermediate metal wiring 12 in the vicinity of the opening 14, and the thickness is partially reduced. As a result, the stress on the interlayer insulating film 10 due to the pressures P1, P2, and P3 from the wirings can be cut off structurally, so the peeling, floating, and cracking of the interlayer insulating film 10 can be stably suppressed. As a result, yield and quality can be stably ensured. Further, it is preferable that the interlayer insulating film 10 be separated in the recess 16. As a result, the stress from the pressures P1, P2, and P3 from the wirings can be cut off.

Embodiment 6

Figure 11:
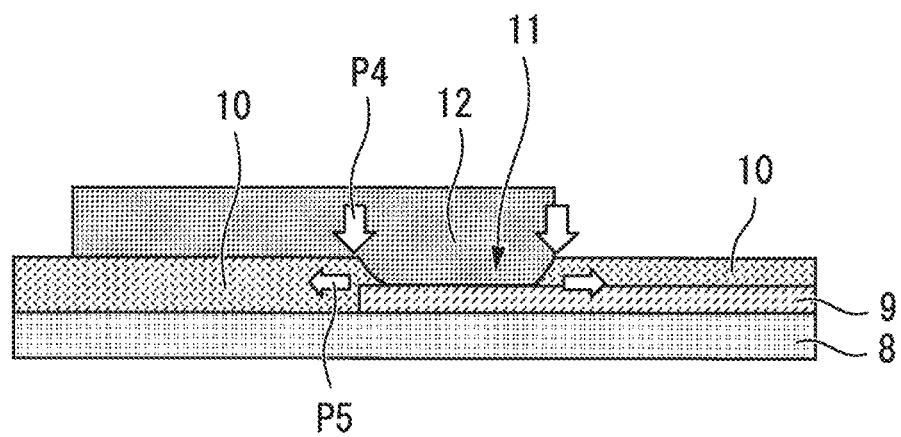
FIG. 11 is a cross-sectional view showing a semiconductor device according to Embodiment 6 of the present invention.

FIG. 11 is a cross-sectional view showing a semiconductor device according to Embodiment 6 of the present invention. The underlying metal wiring 9 is formed on the semiconductor substrate 6. The interlayer insulating film 10 having the opening 11 is formed on the underlying metal wiring 9. The intermediate metal wiring 12 is formed on the interlayer insulating film 10 and connected to the underlying metal wiring 9 through the opening 11. The end portion of the opening 11 is not vertical but tapered. For this reason, the opening area of the opening 11 gradually narrows from the top to the bottom. The end portion of the upper intermediate metal wiring 12 is aligned with the top of the inclined surface of the taper or the corner of the upper portion thereof.

When the interlayer insulating film 10 is a compressive film, a stress is applied vertically downward to the interlayer insulating film 10 at the peripheral edge of the opening 11. Meanwhile, in the case of a tensile film, a stress is applied vertically upward. Where the intermediate metal wiring 12 is formed in that portion, a pressure P4 in the vertical downward direction is applied from the intermediate metal wiring 12 to the opening 11. In this case, a pressure P5 in the horizontal direction is largely applied to the interlayer insulating film 10 from the intermediate metal wiring 12 in the opening 11, regardless of whether the film is compressive or tensile. Meanwhile, since the pressure P5 can be dispersed and reduced by tapering the end portion of the opening 11, it is possible to stably suppress peeling, floating and cracking of the interlayer insulating film 10. As a result, yield and quality can be stably ensured.

Embodiment 7

Figure 12:
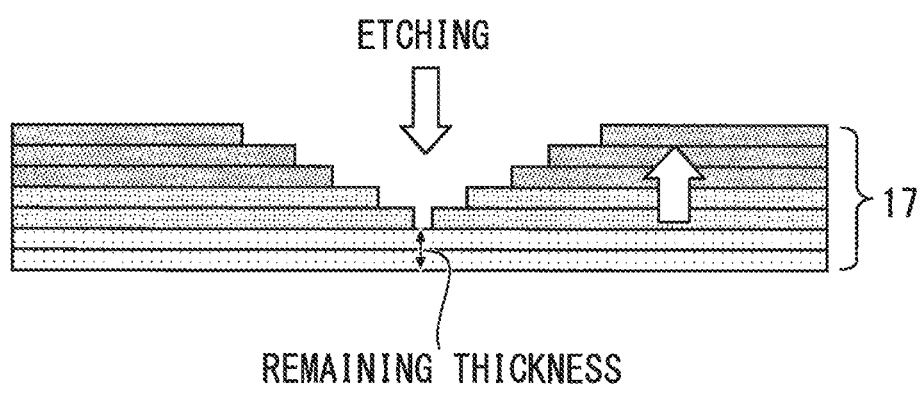
FIG. 12 is a cross-sectional view showing an interlayer insulating film according to Embodiment 7 of the present invention.
Figure 13:
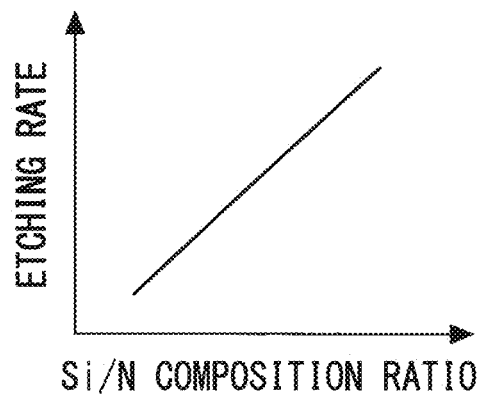
FIG. 13 shows the relationship between the Si/N composition ratio and an etching rate.

FIG. 12 is a cross-sectional view showing an interlayer insulating film according to Embodiment 7 of the present invention. An insulating film 17 is a SiN film in which the Si/N composition ratio rises stepwise from the bottom to the top. FIG. 13 shows the relationship between the Si/N composition ratio and an etching rate. Thus, when the Si/N composition ratio is high, the etching rate becomes large. Therefore, when the insulating film 17 is etched, etching is sequentially performed from the portion with the Si/N composition ratio at which the etching rate is large. As a result, it is possible to form a tapered shape in which the thickness of the insulating film 17 is partially reduced. Further, by adjusting the number of stepwise changes of the Si/N composition ratio and the film thickness of each step, it is possible to adjust the remaining thickness of the partially thinned portion of the insulating film 17.

As a result of using the insulating film 17 according to the present embodiment in the semiconductor devices of Embodiments 1 to 5, the film thickness of the insulating film 17 can be easily adjusted by etching, and the film peeling, film floating and film cracking can be reduced and suppressed according to the state of the insulating film 17.

Embodiment 8

Figure 14:
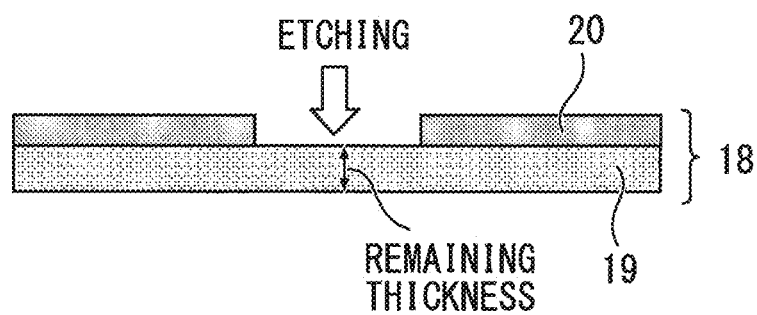
FIG. 14 is a cross-sectional view showing an interlayer insulating film according to Embodiment 8 of the present invention.

FIG. 14 is a cross-sectional view showing an interlayer insulating film according to Embodiment 8 of the present invention. The insulating film 18 has an SiO film 19 and an SiN film 20 formed on the SiO film 19. The SiN film 20 that is the upper layer has an etching rate larger than that of the SiO film 19 that is the lower layer. As a result, when patterning is performed under the condition of selectively etching SiN with respect to SiO, it is possible to leave only the SiO film 19 of the lower layer while etching the SiN film 20 of the upper layer. Then, by adjusting the film thickness of the SiO film 19 of the lower layer, it is possible to adjust the remaining thickness 21 at the location where the interlayer insulating film 10 is to be partially thinned.

As a result of using the insulating film 18 according to the present embodiment in the semiconductor devices of Embodiments 1 to 5, the film thickness of the insulating film 18 can be easily adjusted by etching, and the film peeling, film floating and film cracking can be reduced and suppressed according to the state of the insulating film 18.

REFERENCE SIGNS LIST 1 base material; 2,4,17,18 insulating film; 3 recess; 10 interlayer insulating film; 4 opening; 19 SiO film; 20 SiN film

The invention claimed is:
1. A semiconductor device comprising:
a first wiring;
an insulating film provided on the first wiring and having an opening; and
a second wiring provided on the insulating film and connected to the first wiring through the opening, wherein
a recess is provided in the insulating film in a lower part of an end portion of the second wiring so that a thickness of the insulating film is partially reduced,
the insulating film is separated in the recess, and
a pressure in the vertical direction is applied to the insulating film from the end portion of the second wiring.
2. The semiconductor device according to claim 1, wherein the insulating film is a SiN film in which a Si/N composition ratio rises stepwise from a bottom to a top.
3. The semiconductor device according to claim 1, wherein the insulating film has an SiO film and an SiN film formed on the SiO film.

4. The semiconductor device according to claim 2, wherein the insulating film has an SiO film and an SiN film formed on the SiO film.

* * * * *